United States Patent
Singh

(10) Patent No.: US 8,942,958 B2
(45) Date of Patent: Jan. 27, 2015

(54) METHOD AND APPARATUS FOR CALCULATING SENSOR MODELLING COEFFICIENTS

(75) Inventor: Mahendra Pal Singh, Noida (IN)

(73) Assignee: Freescale Semiconductor, Inc., Austin, TX (US)

(*) Notice: Subject to any disclaimer, the term of this patent is extended or adjusted under 35 U.S.C. 154(b) by 562 days.

(21) Appl. No.: 13/249,256

(22) Filed: Sep. 30, 2011

(65) Prior Publication Data

US 2013/0085724 A1    Apr. 4, 2013

(51) Int. Cl.
*G06F 17/10* (2006.01)
*G06F 17/50* (2006.01)

(52) U.S. Cl.
CPC .................................. *G06F 17/5036* (2013.01)
USPC ............................................................ 703/2

(58) Field of Classification Search
CPC . G06F 17/50; G06F 17/5009; G06F 17/5036; G06F 17/5063; G01D 18/00; G01D 18/008; G01D 21/02; G01K 7/20; G01K 7/21; G01K 7/24; G01K 7/25; G01K 15/00; G01K 15/005; G01L 9/02; G01L 9/025; G01L 9/06; G01L 9/065; G01L 9/08; G01L 9/085; G01L 27/00; G01L 27/002

USPC .............. 703/2, 14; 702/85, 98, 99, 104, 182, 702/184; 374/1
See application file for complete search history.

(56) References Cited

U.S. PATENT DOCUMENTS

| | | | |
|---|---|---|---|
| 4,226,125 A | 10/1980 | Waugh | |
| 4,788,521 A | 11/1988 | Johnson | |
| 5,764,067 A * | 6/1998 | Rastegar | 324/725 |
| 5,946,642 A * | 8/1999 | Hedrick | 702/138 |
| 7,483,795 B2 | 1/2009 | Miller | |
| 8,195,418 B2 * | 6/2012 | Borenstein | 702/104 |
| 8,589,107 B2 * | 11/2013 | Borenstein | 702/104 |
| 8,838,421 B2 | 9/2014 | Singh | |
| 2006/0265167 A1 * | 11/2006 | Laraia et al. | 702/99 |

* cited by examiner

*Primary Examiner* — Kamini S Shah
*Assistant Examiner* — Luke Osborne
(74) *Attorney, Agent, or Firm* — Charles Bergere

(57) ABSTRACT

A method of calculating at least one sensor modelling coefficient for multiple sensor regions of operation includes defining a first sensor region of operation and a further sensor region of operation, and calculating the sensor modelling coefficient for the first sensor region of operation. A derivative equation then is derived for the further sensor region of operation based at least partly on at least one defined inter-region boundary constraint. The sensor modelling coefficient is calculated for the further sensor region of operation based at least partly on the derivative equation.

11 Claims, 3 Drawing Sheets

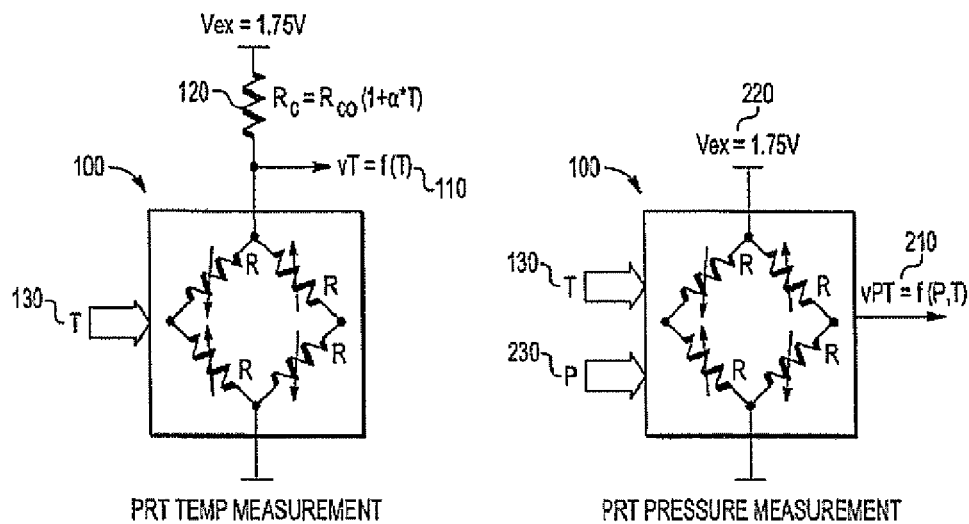
*FIG. 1*  *FIG. 2*
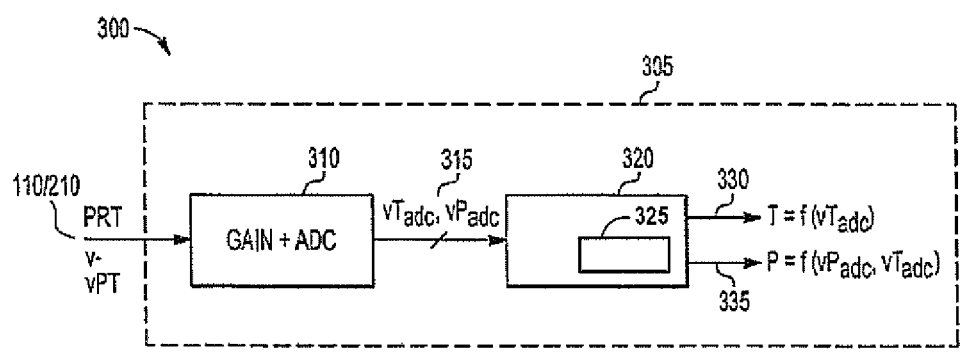
*FIG. 3*

METHOD AND APPARATUS FOR CALCULATING SENSOR MODELLING COEFFICIENTS

BACKGROUND OF THE INVENTION

The present invention relates to a method and apparatus for calculating sensor modelling coefficients, and more particularly to a method and apparatus for calculating sensor modelling coefficients for multiple sensor regions of operation.

In the field of sensor systems, for example pressure and/or temperature sensor systems, the characteristics of sensors vary between different regions of operation. For example, the characteristics of a temperature sensor within a first region of operation of, say, 0° C. to 85° C. may be significantly different to the characteristics of the temperature sensor within a second region of operation of, say, −40° C. to 0° C.

To compensate for such variations, it is necessary to carefully model the sensor characteristics across the different regions of operation. The characteristics of a sensor within a particular region of operation may be modelled using one or more equations, which may be used to provide, in the case of a temperature sensor for example, an estimated temperature value based on an output value from the respective sensor. In order for such equations to accurately model the characteristics of the sensor, accurate equation coefficients must be determined.

One conventional technique for determining such equation coefficients comprises collecting actual data for the sensor, for example actual temperature readings in the case of a temperature sensor, and thereafter calculating the equation coefficients using such actual data. In this manner, it is possible to determine accurate and reliable coefficients in order to enable the characteristics of the sensor to be accurately modelled. However, it is typically prohibitively expensive to take sufficient actual readings across multiple regions of operation for a sensor in order to determine accurate coefficients, and in particular that allows a smooth transition at the junction between adjacent regions of operation.

Thus, it would be advantageous to have a better method of determining sensor modelling coefficients.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

FIG. 1 illustrates a simplified circuit diagram of an example of a piezo resistive transducer configured in a first mode of operation.

FIG. 2 illustrates a simplified circuit diagram of an example of a piezo resistive transducer configured in a second mode of operation.

FIG. 3 illustrates a simplified block diagram of an example of part of a sensor system in accordance with an embodiment of the present invention.

DETAILED DESCRIPTION

Figure 4:
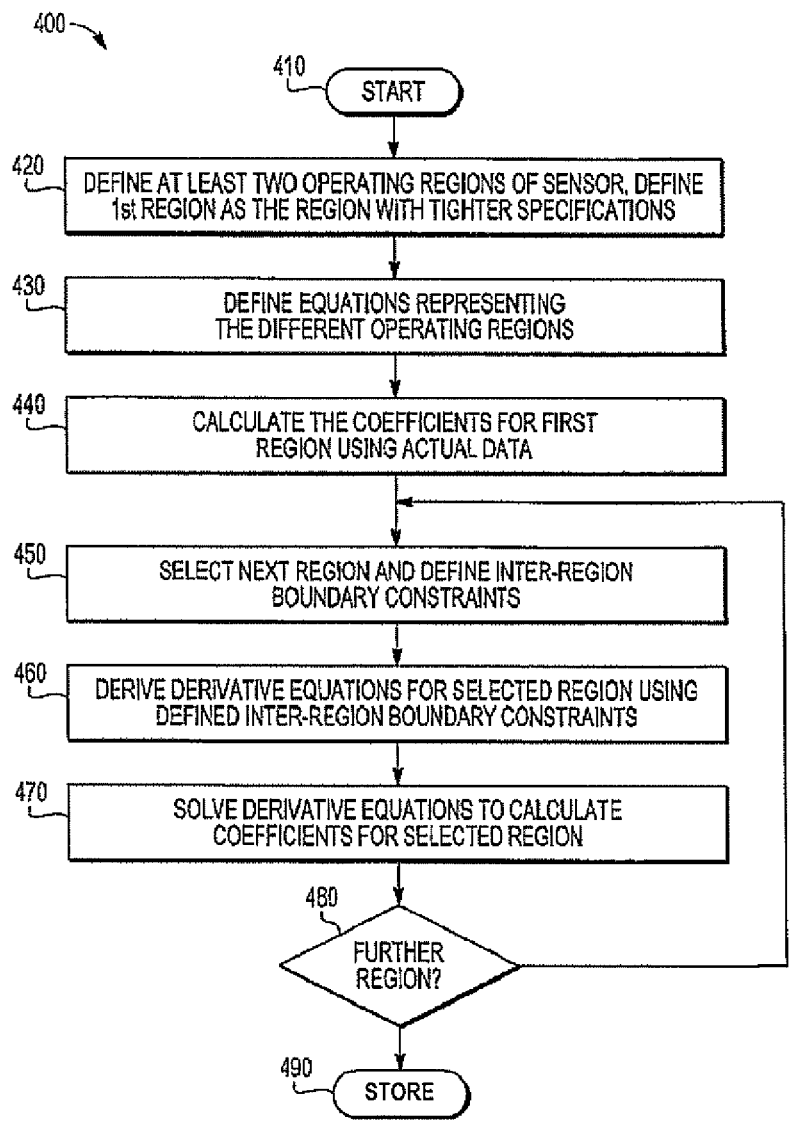
FIG. 4 illustrates a simplified flowchart of an example of a method of calculating sensor modelling coefficients in accordance with an embodiment of the present invention.

Examples of the present invention will now be described with reference to the accompanying drawings. In particular, examples of the present invention are herein described with reference to a temperature/pressure sensor comprising a piezo resistive transducer arranged to provide temperature and/or pressure measurements. However, in some examples, the present invention is not limited to the particular embodiments herein described, and may be equally applied to alternative sensor arrangements for which equation coefficients are required or desired to be determined. Furthermore, because the illustrated embodiments of the present invention may, for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

In one embodiment, the present invention provides a method of calculating sensor modelling coefficients for multiple sensor regions of operation, and in another embodiment, an apparatus comprising at least one signal processing module for calculating sensor modelling coefficients for multiple sensor regions of operation. The apparatus may comprise an integrated circuit that generates sensor measurement values based at least partly on at least one of the calculated sensor modelling coefficients. These and other aspects of the invention will be apparent from and elucidated with reference to the embodiments described hereinafter.

Referring first to FIGS. 1 and 2, there are illustrated simplified circuit diagrams of examples of a piezo resistive transducer 100 configured within a sensor system, for example a pressure sensor system.

FIG. 1 illustrates a simplified circuit diagram of an example of the piezo resistive transducer 100, which in the illustrated example resembles a Wheatstone bridge, configured in a first mode of operation to provide a voltage signal vT 110 that is representative of temperature 130. In this first configuration, the piezo resistive transducer 100 is operably coupled in series with a resistance element 120 in order to provide a voltage divider configuration with the voltage signal vT 110 as an output thereof. Variations in temperature 130 cause representative variations in the resistance of the piezo resistive transducer 100, and therefor cause correspondingly representative variations in the voltage signal vT 110.

FIG. 2 illustrates a simplified circuit diagram of an example of the piezo resistive transducer 100 configured in a second mode to provide a voltage signal vPT 210 representative of both pressure 230 and temperature 130. In this second configuration, an excitation voltage Vex 220 causes a differential output voltage vPT 210 that is a function of both pressure 230 and temperature 130. Variations predominantly in pressure 230 and to some extent in temperature 130 cause representative variations in the voltage signal vPT 210.

FIG. 3 illustrates a simplified block diagram of an example of part of a sensor system 300 to which the piezo resistive transducer 100 may be operably coupled, and to which the temperature and pressure voltage signals vT 110 and vPT 210 output by the piezo resistive transducer 100 may be provided. The sensor system 300 may be implemented within an integrated circuit device 305, for example within an application specific integrated circuit (ASIC) device or the like, and comprises a gain and an analogue to digital converter (ADC) component 310 which receives the temperature and pressure voltage signals vT 110 and vPT 210 and outputs digital representations ($vT_{ADC}$ and $vP_{ADC}$ respectively) 315 thereof. The digital representations of the temperature and pressure voltage signals 315 are then provided to a signal processing component, which in the illustrated example comprises a data path 320, which processes the temperature and pressure voltage values 315 in order to generate estimated respective temperature and pressure values 330, 335.

For example, the piezo resistive transducer 100 may be initially configured to operate in a first mode of operation, and to provide the voltage signal vT 110, which is representative of temperature, to the ADC component 310, which in turn outputs a digital representation $T_{adc}$ of the temperature voltage signal. The piezo resistive transducer 100 may then be configured to operate in a second mode of operation, and to provide the voltage signal vPT 210, which is representative of temperature and pressure, to the ADC component 310, which in turn outputs a digital representation $P_{adc}$ of the pressure voltage signal.

The data path 320 then processes the digital representations of the temperature and pressure voltage signals 315 to generate an estimated temperature value 330 and an estimated pressure value 335. In some examples, the processing component that is referred to a 'data path 320' may be a digital signal processor (DSP) or similar. The order in which the digital representations of the temperature and pressure voltage signals 315 are processed may be interchanged, and sampling of the temperature and pressure voltage signals vT 110 and vPT 210 may be performed substantially independent.

In one example, the data path 320 may be arranged to generate the estimated temperature value 330 based on a first sensor modelling equation, such as of the form of Equation 1 below:

$$T = cT_0 + cT_1 \cdot T_{adc} cT_2 \cdot T_{adc}^2 + cT_3 \cdot T_{adc}^3 \cdot cT_4 \cdot T_{adc} \cdot P_{adc} + cT_5 \cdot P_{adc}$$ [Equation 1]

where $cT_i$ comprises a first set of sensor modelling coefficients. Similarly, the data path 320 may be arranged to generate the estimated pressure value 335 based on a second modelling equation, such as of the form of Equation 2 below:

$$P = C_0 + C \cdot P_{adc} + C_2 \cdot T + C_3 \cdot P$$ [Equation 2]

where $C_i$ comprises a second set of sensor modelling coefficients.

Thus, in this example, the data path 320 may first generate an estimate of the temperature T 330 using Equation 1 above, with parameters of the digital representations of the temperature and pressure voltage signals $T_{adc}$ and $P_{adc}$, 315 and the first set of sensor modelling coefficients $cT_i$. Having generated an estimate of the temperature T 330, the data path 320 may then generate an estimate of the pressure P 335 using Equation 2 above, with parameters of the digital representations of the pressure voltage signal $P_{adc}$, the estimate of the temperature T and the second set of sensor modelling coefficients $C_i$. The first and second sets of sensor modelling coefficients $cT_i$ and $C_i$ preferably are stored in a memory 325 of the data path 320.

The characteristics of sensors such as the piezo resistive transducer 100 illustrated in FIGS. 1 and 2, typically vary between different regions of operation. For example, the characteristics of a temperature sensor within a first region of operation of, say, 0° C. to 85° C. may be significantly different to the characteristics of the temperature sensor within a second region of operation, say, −40° C. to 0° C. Accordingly, different sets of sensor modelling coefficients are required to accurately model the different regions of operation, and potentially even different modelling equations. This separation into multiple regions may be independent of choice of temperature sensor, and is not solely limited to the use of piezo resistive transducers.

In order for such equations to accurately model the characteristics of the piezo resistive transducer 100, accurate sensor modelling coefficients must be determined. One conventional technique for determining such coefficients comprises collecting actual data for the sensor, for example actual temperature and pressure readings in this example, and calculating the modelling coefficients using curve fitting based on such actual data. In this manner, it is possible to determine accurate and reliable coefficients to enable the characteristics of the sensor to be accurately modelled. However, it is typically prohibitively expensive to take sufficient actual readings across multiple regions of operation for a sensor in order to determine accurate coefficients, and in particular which allow a smooth transition at the junction between adjacent regions of operation.

Referring now to FIG. 4, there is illustrated a simplified flowchart 400 of an example of a method of calculating sensor modelling coefficients for multiple sensor regions of operation. In summary, the method comprises defining a first sensor region of operation and at least one further sensor region of operation, calculating at least one sensor modelling coefficient for the first sensor region of operation, deriving derivative equations for the at least one further sensor region of operation based at least partly on at least one defined inter-region boundary constraint, and calculating at least one sensor modelling coefficient for the at least one further sensor region of operation based at least partly on the derivative equations.

Referring to FIG. 4 in more detail, the method starts at 410, and moves on to 420 where at least two sensor regions of operation are defined or identified. In some examples, the method further comprises defining as a first sensor region of operation, a region comprising tighter specifications. For example, for the piezo resistive transducer 100 of FIGS. 1 and 2, two or more temperature regions of operation may be defined or identified, for example a first region of operation of, say, 0° C. to 85° C. for which tighter product specifications are required, and a second region of operation of, say, −40° C. to 0° C.

Next, at 430, one or more sensor modelling equations are defined for each defined region of operation, such as Equations 1 and 2 above. In some example embodiments, the same sensor modelling equations may be defined for modelling the sensor characteristics of the different regions of operation. Alternatively, in some examples, different sensor modelling equations may be defined for modelling the sensor characteristics of the different regions of operation. Accordingly, the method may comprise defining a first set of sensor modelling equations comprising sensor modelling coefficients for the first sensor region of operation and at least one further set of sensor modelling equations comprising sensor modelling coefficients for at least one further sensor region of operation.

The method then moves on to 440, where sensor modelling coefficients for the sensor modelling equation(s) of the first region of operation are calculated. For Equations 1 and 2 above, such sensor modelling coefficients may comprise the first and second sets of sensor modelling coefficients $cT_i$ and $C_i$ for modelling the first region of operation of the piezo resistive transducer 100. Such sensor modelling coefficients for the first region of operation may be calculated using any suitable technique. For example, such sensor modelling coefficients may be calculated using actual data, for example data obtained by taking readings, etc., across the first region of operation, establishing equations (e.g. based on the defined sensor modelling equation(s)) using such data readings in the form of unknown coefficients, and solving the established equations to establish a curve fit, for example using Least Mean Square (LMS) or other methods.

Next, at 450, the method continues in selecting a next region of operation, for example a region adjacent to the first region for which coefficients have already been calculated, and defining one or more inter-region boundary constraints. Derivative equations for this selected region of operation are then derived based at least partly on the one or more defined inter-region boundary constraints.

For example, Equation 1, as illustrated above for estimating temperature, may be defined for the first region of operation as:

$$T_i = cT_{01} + cT_{11} \cdot T_{adc} + cT_{21} \cdot T_{adc}^2 + cT_{31} \cdot T_{adc}^3 + cT_{41} \cdot T_{adc} \cdot P_{adc} + cT_{51} \cdot P_{adc} \quad \text{[Equation 3]}$$

where $cT_{i1}$ comprises a set of sensor modelling coefficients for the first region of operation. Similarly, Equation 1 may be defined for the second region of operation as:

$$T_2 = cT_{02} + cT_{12} \cdot T_{adc} + cT_{22} \cdot T_{adc}^2 + cT_{32} \cdot T_{adc}^3 + cT_{42} \cdot T_{adc} \cdot P_{adc} + cT_{52} \cdot P_{adc} \quad \text{[Equation 4]}$$

where $cT_{i2}$ comprises a set of sensor modelling coefficients for the second region of operation.

An example of a defined boundary constraint may comprise setting $T_1 = T_2$ at an inter-region boundary between the first and second regions of operation. Such a boundary constraint, with respect to Equations 3 and 4 above, leads to:

$$cT_{01} + cT_{11} \cdot T_{adc} + cT_2 \cdot T_{adc}^2 + cT_{31} \cdot T_{adc}^3 + cT_{41} \cdot T_{adc} \cdot P_{adc} + cT_{51} \cdot P_{adc} = cT_{02} + cT_{12} \cdot T_{adc} + cT_{22} \cdot T_{adc}^2 + cT_{32} \cdot T_{adc}^3 + cT_{42} \cdot T_{adc} \cdot P_{adc} + cT_{52} \cdot P_{adc} \quad \text{[Equation 5]}$$

at, say, 0° C. and 101.3 kPa. By setting $T_1 = T_2$ at the inter-region boundary between the first and second regions of operation, continuity at the junction between the two regions of operation may be achieved.

Another example of a defined boundary constraint may comprise setting $dT_1/dVt = dT_2/dVt$ at the inter-region boundary between the first and second regions of operation. Such a boundary constraint, with respect to Equations 3 and 4 above, leads to:

$$cT_{11} + 2*cT_{21} \cdot T_{adc} + 3*cT_{31} \cdot T_{adc}^2 + cT_{41} \cdot P_{adc} = cT_{12} + 2*cT_{22} \cdot T_{adc} + 3*cT_{32} \cdot T_{adc}^2 + cT_{42} \cdot P_{adc} \quad \text{[Equation 6]}$$

By setting $dT_1/dVt = dT_2/dVt$ at the inter-region boundary between the first and second regions of operation, smoothness of transition with changing temperature at the junction between the two regions of operation may be achieved.

Another example of a defined boundary constraint may comprise setting $dT_1/dVp = dT_2/dVp$ at the inter-region boundary between the first and second regions of operation. Such a boundary constraint, with respect to Equations 3 and 4 above leads to:

$$cT_{41} \cdot T_{adc} + cT_{51} = cT_{42} \cdot T_{adc} + P_{adc} \quad \text{[Equation 7]}$$

By setting $dT_1/dVp = dT_2/dVp$ at the inter-region boundary between the first and second regions of operation, smoothness of transition with changing pressure at the junction between the two regions of operation may be achieved.

Thus, in this example three derivative equations may be established in this manner, namely Equations 5, 6 and 7, thereby enabling up to three coefficients for the second region of operation to be calculated without requiring any actual data readings for the second region of operation to be taken, as well as enabling continuity and smoothness of transition to be achieved at the junction between the two regions of operation.

Since the coefficients for the first region of operation (i.e. those originating from Equation 3) have already been calculated (at 440), these three derivative equations comprise only unknown coefficients for the second region of operation. For the particular sensor modelling equation used in this example, namely based on Equation 1 above, these three derivative equations comprise six unknown coefficients; these six unknown coefficients being $cT_{02}$, $cT_{12}$, $cT_{22}$, $cT_{32}$, $cT_{42}$ and $cT_{52}$.

Further derivative equations may be created to solve for all six unknown coefficients (i.e. in this example to solve for the further three unknown coefficients). For example, such further derivative equations may be created using actual data readings for the second region of operation, using mean coefficient readings, and/or introducing other constraints similar to those identified above for Equations 5, 6 and 7 for higher order differentials such as, say, setting $d^2T_1/dVp^2 = d^2T_2/dVp^2$. Alternatively, in some examples, a sensor modelling equation of lower order may be used for the second region in order to reduce the number of unknown coefficients, for example to just three unknown coefficients.

Having derived the necessary derivative equations for the second region at 460, these derivative equations may then be solved at 470 in order to calculate the sensor modelling coefficients for the second region of operation. If coefficients for a further region of operation are required to be calculated, at 480, the method may loop back to 450, and the procedure may be repeated for that further region of operation. Once coefficients have been calculated for all regions of operation, the coefficients are stored at step 490 for use in converting at least one digitized sensor signal, such as the digital representations of the temperature and pressure voltage signals 315 illustrated in FIG. 3, to an estimated sensor output.

Advantageously, establishing derivative equations for further sensor regions of operation based at least partly on at least one defined inter-region boundary constraint as described above reduce (and potentially alleviate) the need for actual data reading to be taken for further regions of operation outside of the first region of operation. In this manner, whilst actual data reading may be taken for the first region of operation, and thereby enabling accurate coefficients to be calculated based on such actual data readings therefor, fewer (if any) additional data readings may be required for further regions of operation. In this manner, the prohibitive expense of taking such readings across multiple regions of operation may be substantially reduced.

Figure 5:
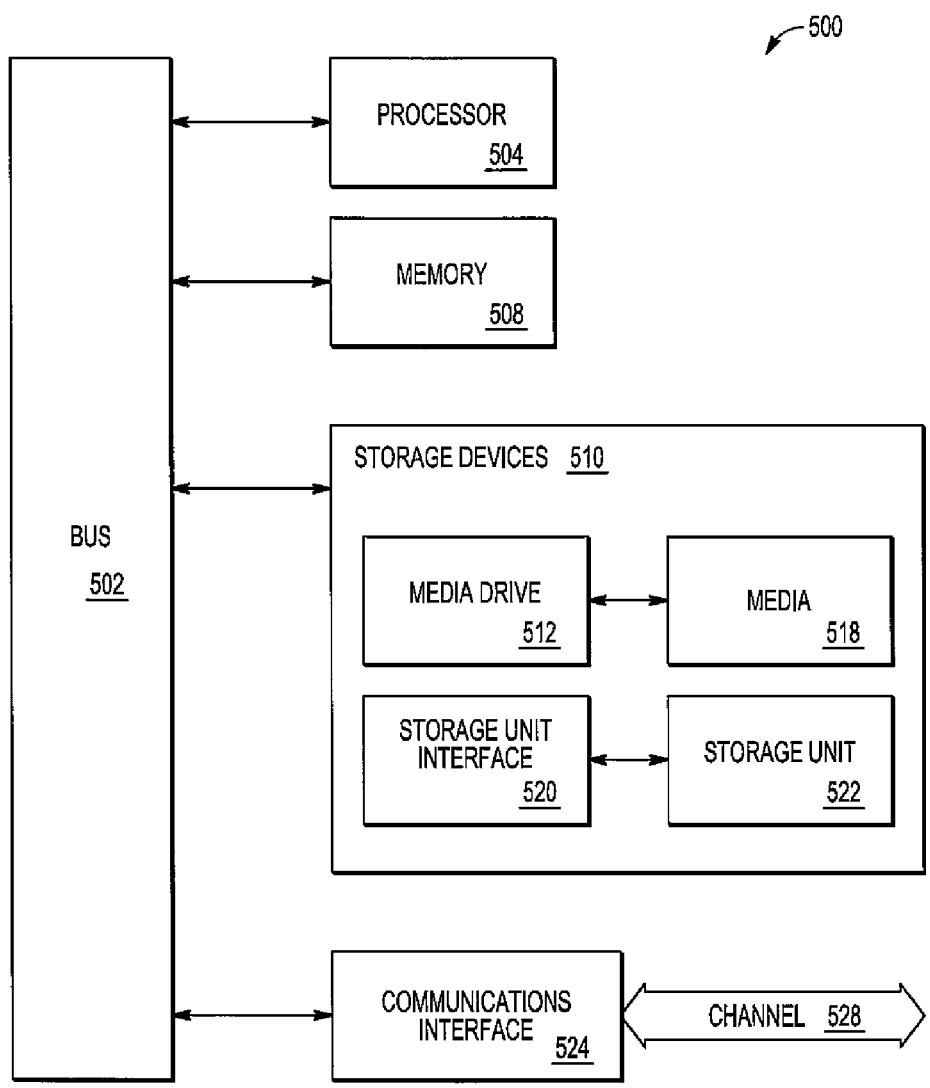
FIG. 5 illustrates an example of a computing system in accordance with an embodiment of the present invention.

Referring now to FIG. 5, there is illustrated an example of a typical computing system 500 that may be employed to implement signal processing functionality in embodiments of the invention, and in particular may be employed to implement at least part of the method of FIG. 4. Computing systems of this type may be used in desktop computers, workstations etc. Those skilled in the relevant art will also recognize how to implement the invention using other computer systems or architectures. Computing system 500 may represent, for example, a desktop, laptop or notebook computer, hand-held computing device (PDA, cell phone, palmtop, etc.), mainframe, server, client, or any other type of special or general purpose computing device as may be desirable or appropriate for a given application or environment. Computing system 500 can include one or more signal processing modules, such as a processor 504. Processor 504 can be implemented using a general or special-purpose processing engine such as, for example, a microprocessor, microcontroller or other control module. In this example, processor 504 is connected to a bus 502 or other communications medium.

Computing system 500 can also include a main memory 508, such as random access memory (RAM) or other dynamic memory, for storing information and instructions to be executed by processor 504. Main memory 508 also may be used for storing temporary variables or other intermediate information during execution of instructions to be executed by processor 504. Computing system 500 may likewise include a read only memory (ROM) or other static storage device coupled to bus 502 for storing static information and instructions for processor 504.

The computing system 500 may also include information storage system 510, which may include, for example, a media drive 512 and a removable storage interface 520. The media drive 512 may include a drive or other mechanism to support fixed or removable storage media, such as a hard disk drive, a floppy disk drive, a magnetic tape drive, an optical disk drive, a compact disc (CD) or digital video drive (DVD) read or write drive (R or RW), or other removable or fixed media drive. Storage media 518 may include, for example, a hard disk, floppy disk, magnetic tape, optical disk, CD or DVD, or other fixed or removable medium that is read by and written to by media drive 512. As these examples illustrate, the storage media 518 may include a computer-readable storage medium having particular computer software or data stored therein.

In alternative embodiments, information storage system 510 may include other similar components for allowing computer programs or other instructions or data to be loaded into computing system 500. Such components may include, for example, a removable storage unit 522 and an interface 520, such as a program cartridge and cartridge interface, a removable memory (for example, a flash memory or other removable memory module) and memory slot, and other removable storage units 522 and interfaces 520 that allow software and data to be transferred from the removable storage unit 518 to computing system 500.

Computing system 500 can also include a communications interface 524. Communications interface 524 can be used to allow software and data to be transferred between computing system 500 and external devices. Examples of communications interface 524 can include a modem, a network interface (such as an Ethernet or other NIC card), a communications port (such as for example, a universal serial bus (USB) port), a PCMCIA slot and card, etc. Software and data transferred via communications interface 524 are in the form of signals which can be electronic, electromagnetic, and optical or other signals capable of being received by communications interface 524. These signals are provided to communications interface 524 via a channel 528. This channel 528 may carry signals and may be implemented using a wireless medium, wire or cable, fiber optics, or other communications medium. Some examples of a channel include a phone line, a cellular phone link, an RF link, a network interface, a local or wide area network, and other communications channels.

In this document, the terms 'computer program product' 'computer-readable medium' and the like may be used generally to refer to media such as, for example, memory 508, storage device 518, or storage unit 522. These and other forms of computer-readable media may store one or more instructions for use by processor 504, to cause the processor to perform specified operations. Such instructions, generally referred to as 'computer program code' (which may be grouped in the form of computer programs or other groupings), when executed, enable the computing system 500 to perform functions of embodiments of the present invention. Note that the code may directly cause the processor to perform specified operations, be compiled to do so, and/or be combined with other software, hardware, and/or firmware elements (e.g., libraries for performing standard functions) to do so.

In an embodiment where the elements are implemented using software, the software may be stored in a computer-readable medium and loaded into computing system 500 using, for example, removable storage drive 522, drive 512 or communications interface 524. The control module (in this example, software instructions or executable computer program code), when executed by the processor 504, causes the processor 504 to perform the functions of the invention as described herein.

The expression non-transitory refers to the non-ephemeral nature of the storage medium itself rather than to a notion of how long the stored information persists in a stored state. Accordingly, memories that might otherwise be viewed, for example, as being volatile (such as many electronically-erasable programmable read-only memories (EEPROMs) or random-access memories (RAMs)) are to be viewed as being "non-transitory" whereas a signal being transmitted over a carrier (such a wire or wirelessly) is considered "transitory" notwithstanding that the signal may remain in transit for a lengthy period of time.

The present invention may be implemented in a computer program for running on a computer system, at least including code portions for performing steps of a method according to the invention when run on a programmable apparatus, such as a computer system or enabling a programmable apparatus to perform functions of a device or system according to the invention. A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on computer readable storage medium or transmitted to the computer system via a computer readable transmission medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; non-volatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, in the example illustrated in FIG. 3 the gain plus ADC component 310 and data path 320 have been illustrated as separate logic blocks within the integrated circuit device. However, it is contemplated that the functionality of the gain plus ADC component 310 and the functionality of the data path 320 may at least partly be implemented within a single functional element.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected', or 'operably coupled', to each other to achieve the desired functionality.

Those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

The examples, or portions thereof, may implemented as soft or code representations of physical circuitry or of logical representations convertible into physical circuitry, such as in a hardware description language of any appropriate type. The invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'. However, other modifications, variations and alternatives are also possible. The specifications and drawings are, accordingly, to be regarded in an illustrative rather than in a restrictive sense.

The invention claimed is:

1. A method of calculating at least one sensor modelling coefficient for multiple sensor regions of operation, the method comprising:
    defining a first sensor region of operation and at least one further sensor region of operation;
    defining a first set of sensor modelling equations that comprise at least one sensor modelling coefficient for the first sensor region of operation, and at least one further set of sensor modelling equations that comprise at least one sensor modelling coefficient for the at least one further sensor region of operation;
    calculating the at least one sensor modelling coefficient for the first sensor region of operation;
    deriving at least one derivative equation for the at least one further sensor region of operation based at least partly on at least one defined inter-region boundary constraint, the first set of sensor modelling equations, and the at least one further set of sensor modelling equations;
    calculating the at least one sensor modelling coefficient for the at least one further sensor region of operation based at least partly on the at least one derivative equation; and
    storing the calculated coefficient for the first sensor region and the calculated coefficient for the at least one further sensor region in a sensor system for converting a digitized sensor signal to an estimated sensor output signal.

2. The method of claim 1, wherein the method comprises defining as the first sensor region of operation a region comprising a tighter specification than a specification of the at least one further sensor region of operation, wherein the tighter specification means that the at least one sensor modelling coefficient for the first sensor region of operation is required to be more accurate than the at least one sensor modelling coefficient for the at least one further sensor region of operation.

3. The method of claim 1, wherein the at least one inter-region boundary constraint comprises at least one of:
    a sensor modelling equation for the first and at least one further sensor region of operation that are set to be equal at a junction between the two sensor regions; and
    a rate of change in a plurality of curves for the at least one sensor modelling equation in relation to at least one sensor measurement is set to be equal.

4. The method of claim 1, further comprising:
    calculating the at least one sensor modelling coefficient of the at least one further sensor region of operation additionally based at least partly on at least one from a group of:
    at least one data reading;
    at least one mean coefficient reading; and
    at least one further constraint based on a higher order differential.

5. The method of any claim 1, wherein the method comprises calculating at the least one sensor modelling coefficient for the first sensor region of operation by way of:
    taking at least one data reading;
    establishing at least one equation using the at least one data reading in a form of at least one unknown coefficient; and
    solving the at least one equation for the at least one unknown coefficient to establish a curve fit.

6. The method of claim 1, wherein the method comprises a method of calculating at least one sensor modelling coefficient for multiple sensor regions of operation for at least one of a temperature sensor and a pressure sensor.

7. The method of claim 1, further comprising:
reading the stored coefficient for the first sensor region and the stored coefficient for the at least one further sensor region calculated;
estimating at least one estimated sensor output signal using the read stored coefficients; and
outputting an at least one estimated sensor output signal.

8. An apparatus comprising at least one signal processing module arranged to calculate at least one sensor modelling coefficient for multiple sensor regions of operation, the at least one signal processing module being arranged to:
define a first sensor region of operation and at least one further sensor region of operation;
define a first set of sensor modelling equations that comprise at least one sensor modelling coefficient for the first sensor region of operation, and at least one further set of sensor modelling equations that comprises at least one sensor modelling coefficient for the at least one further sensor region of operation;
calculate at least one sensor modelling coefficient for the first sensor region of operation;
derive at least one derivative equation for the at least one further sensor region of operation based at least partly on at least one defined inter-region boundary constraint, the first set of sensor modelling equations, and the at least one further set of sensor modelling equations;
calculate the at least one sensor modelling coefficient for the at least one further sensor region of operation based at least partly on the at least one derivative equation; and
store the calculated coefficient for the first sensor region and the calculated coefficient for the at least one further sensor region for use in converting at least one digitized sensor signal to an estimated sensor output.

9. The apparatus of claim 8, wherein the apparatus is an integrated circuit device.

10. A sensor system, comprising:
an analog to digital converter that receives a temperature voltage signal and a pressure voltage signal and converts the temperature and pressure voltage signals to digital temperature and pressure voltage signals; and
a signal processor that receives the digital temperature and pressure voltage signals and converts the digital temperature and pressure voltage signals to temperature and pressure values using at least first and second modelling equations having respective first and second sets of coefficients,
wherein the first set of coefficients is generated by calculating at least one sensor modelling coefficient for multiple sensor regions of operation, comprising:
defining a first sensor region of operation and at least one further sensor region of operation;
defining a first set of sensor modelling equations that comprise at least one sensor modelling coefficient for the first sensor region of operation, and at least one further set of sensor modelling equations that comprises at least one sensor modelling coefficient for the at least one further sensor region of operation;
calculating the at least one sensor modelling coefficient for the first sensor region of operation;
deriving at least one derivative equation for the at least one further sensor region of operation based at least partly on at least one defined inter-region boundary constraint, the first set of sensor modelling equations, and the at least one further set of sensor modelling equations; and
calculating the at least one sensor modelling coefficient for the at least one further sensor region of operation based at least partly on the at least one derivative equation.

11. The sensor of claim 10, further comprising a memory for storing the first and second sets of coefficients.

* * * * *